US010840295B2

(12) United States Patent
Sandberg et al.

(10) Patent No.: US 10,840,295 B2
(45) Date of Patent: Nov. 17, 2020

(54) FLUXONIUM QUBITS AND DEVICES INCLUDING PLURALITY OF VERTICAL STACKS OF JOSEPHSON JUNCTIONS

(71) Applicant: INTERNATIONAL BUSINESS MACHINES CORPORATION, Armonk, NY (US)

(72) Inventors: Martin O. Sandberg, Ossining, NY (US); Vivekananda P. Adiga, Ossining, NY (US); Rasit O. Topaloglu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/387,420

(22) Filed: Apr. 17, 2019

(65) Prior Publication Data
US 2020/0335549 A1    Oct. 22, 2020

(51) Int. Cl.
*H01L 27/18*  (2006.01)
*G06N 10/00*  (2019.01)
(Continued)

(52) U.S. Cl.
CPC ............ *H01L 27/18* (2013.01); *G06N 10/00* (2019.01); *H01L 39/025* (2013.01); *H01L 39/2493* (2013.01)

(58) Field of Classification Search
CPC ... H01L 27/18; H01L 39/025; H01L 39/2493; G06N 10/00
See application file for complete search history.

(56) References Cited

U.S. PATENT DOCUMENTS 4,837,604 A * 6/1989 Faris ..................... H01L 39/228
257/36
6,348,699 B1    2/2002 Zehe
(Continued)

FOREIGN PATENT DOCUMENTS

EP    3296932 A1    3/2018
WO    2018030977 A1    2/2018

OTHER PUBLICATIONS

Gorria et al., "Fluxon dynamics in three stacked Josephson junctions", Physical Review B 66, 172503-1-172503-4, Nov. 2002.
(Continued)

*Primary Examiner* — Matthew E. Gordon
(74) *Attorney, Agent, or Firm* — Henry J. Daley; Venable LLP

(57) ABSTRACT

A fluxonium qubit includes a superinductor. The superinductor includes a substrate, and a first vertical stack extending in a vertical direction from a surface of the substrate. The first vertical stack includes a first Josephson junction and a second Josephson junction connected in series along the vertical direction. The superinductor includes a second vertical stack extending in a vertical direction from a surface of the substrate. The second vertical stack includes a third Josephson junction. The superinductor includes a superconducting connector connecting the first and second vertical stacks in series such that the first, second, and third Josephson junctions are connected in series. The fluxonium qubit further includes a shunted Josephson junction connected to the superinductor with superconducting wires such that the first, second, and third Josephson junctions of the superinductor that are in series are connected in parallel with the shunted Josephson junction.

25 Claims, 14 Drawing Sheets

(51) Int. Cl.
 *H01L 39/24* (2006.01)
 *H01L 39/02* (2006.01)

(56) References Cited

U.S. PATENT DOCUMENTS 6,441,394 B2  8/2002  Kasai et al.
8,032,196 B2  10/2011 Wakana et al.
8,954,125 B2  2/2015  Corcoles Gonzalez et al.

OTHER PUBLICATIONS

Filatrella G. et al., "Emission of radiation from square arrays of stacked Josephson junctions", Journal of Applied Physics, American Institute of Physics, US, vol. 90, No. 11, Dec. 1, 2001, pp. 5675-5679.
Wang H B et al., "Three-dimensional arrays of BiSrCacUo-2212 intrinsic Josephson junctions and zero-crossing Shapiro steps at 760 GHz", Applied Physics Letters, A I P Publishing LLC, US, vol. 80, No. 9, Mar. 4, 2002, pp. 1604-1606.
PCT/EP2020/058405 International Search Report dated Jun. 3, 2020.
PCT/EP2020/058405 Written Opinion dated Jun. 3, 2020.

\* cited by examiner

FLUXONIUM QUBITS AND DEVICES INCLUDING PLURALITY OF VERTICAL STACKS OF JOSEPHSON JUNCTIONS

BACKGROUND

The present invention relates to an inductor device, and more specifically, to a superinductor device having vertically stacked Josephson junction inductors.

In several superconducting quantum applications, for example, fluxonium style quantum bits and traveling wave parametric amplifiers, lossless inductors with large inductance are desirable. One way to fabricate such an inductor is to use arrays of Josephson junctions. Traditionally these arrays have been made to be in a planar configuration. However, the surface area required for planar arrays becomes prohibitively large as the number of Josephson junctions increases.

SUMMARY

According to an embodiment of the present invention, a fluxonium qubit includes a superinductor. The superinductor includes a substrate, a first vertical stack extending in a vertical direction from a surface of the substrate, the first vertical stack including a first Josephson junction and a second Josephson junction connected in series along the vertical direction. The superinductor further includes a second vertical stack extending in the vertical direction from the surface of the substrate and spaced apart from the first vertical stack. The second vertical stack includes a third Josephson junction. The superinductor includes a superconducting connector connecting the first and second vertical stacks in series such that the first, second, and third Josephson junctions are connected in series. The fluxonium qubit further includes a shunted Josephson junction connected to the superinductor with superconducting wires such that the first, second, and third Josephson junctions of the superinductor that are in series are connected in parallel with the shunted Josephson junction.

According to an embodiment of the present invention, a method of producing a fluxonium qubit includes forming, on a substrate, a first vertical stack extending in a vertical direction from a surface of the substrate, the first vertical stack including a first Josephson junction and a second Josephson junction connected in series along the vertical direction. The method further includes forming, on the substrate, a second vertical stack extending in the vertical direction from the surface of the substrate and spaced apart from the first vertical stack. The second vertical stack includes a third Josephson junction. The method further includes forming a superconducting connector connecting the first and second vertical stacks in series such that the first, second, and third Josephson junctions are connected in series, and connecting a shunted Josephson junction to the first and second vertical stacks such that the first, second, and third Josephson junctions of the superinductor that are in series are connected in parallel with the shunted Josephson junction.

According to an embodiment of the present invention, a superinductor includes a substrate, a first vertical stack extending in a vertical direction from a surface of the substrate, the first vertical stack including a first Josephson junction and a second Josephson junction connected in series along the vertical direction. The superinductor further includes a second vertical stack extending in the vertical direction from the surface of the substrate and spaced apart from the first vertical stack. The second vertical stack includes a third Josephson junction. The superinductor includes a superconducting connector connecting the first and second vertical stacks in series such that the first, second, and third Josephson junctions are connected in series.

According to an embodiment of the present invention, a quantum computer includes a refrigeration system under vacuum including a containment vessel, and a qubit chip contained within a refrigerated vacuum environment defined by the containment vessel. The qubit chip includes a plurality of fluxonium qubits. The quantum computer further includes a plurality of electromagnetic waveguides arranged within the refrigerated vacuum environment so as to direct electromagnetic energy to and receive electromagnetic energy from at least a selected one of the plurality of fluxonium qubits. Each of the plurality of fluxonium qubits includes a superinductor. The superinductor includes a substrate, and a first vertical stack extending in a vertical direction from a surface of the substrate. The first vertical stack includes a first Josephson junction and a second Josephson junction connected in series along the vertical direction. The superinductor further includes a second vertical stack extending in the vertical direction from the surface of the substrate and spaced apart from the first vertical stack. The second vertical stack includes a third Josephson junction. The superinductor includes a superconducting connector connecting the first and second vertical stacks in series such that the first, second, and third Josephson junctions are connected in series. Each fluxonium qubit further includes a shunted Josephson junction connected to the superinductor with superconducting wires such that the first, second, and third Josephson junctions of the superinductor that are in series are connected in parallel with the shunted Josephson junction.

The devices and methods disclosed herein enable large numbers of Josephson junctions to be connected in series in a significantly reduced planar surface area as compared to traditional Josephson junction arrays.

DETAILED DESCRIPTION

Figure 1A:
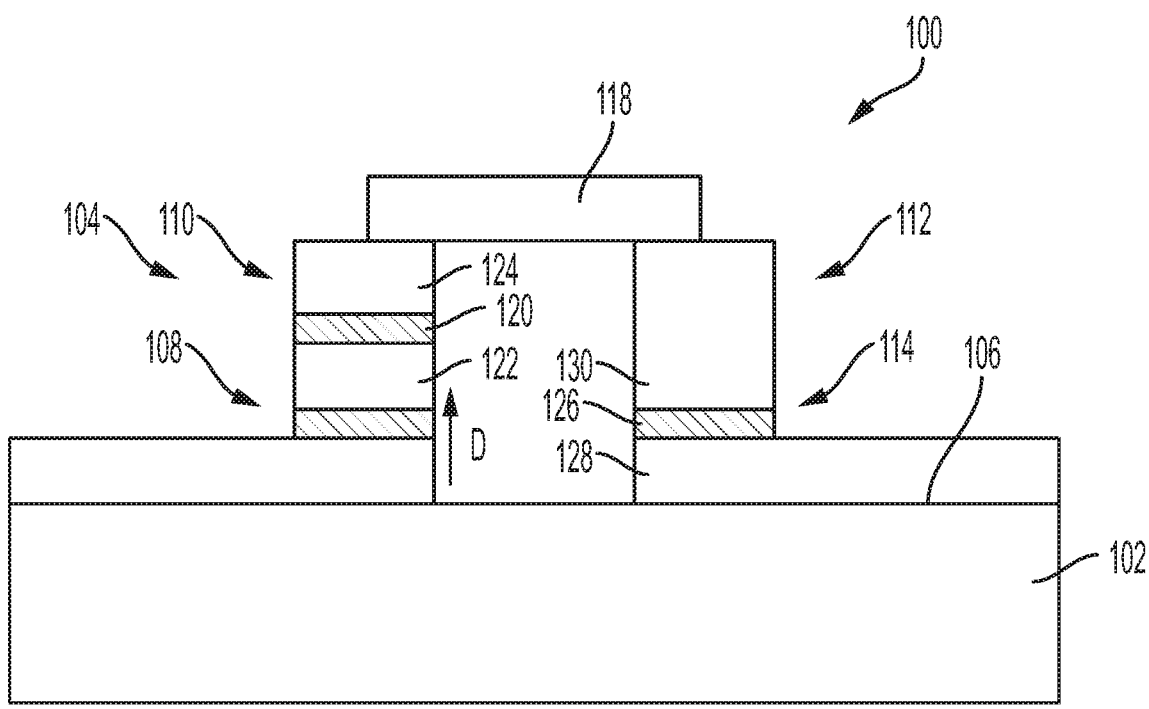
FIG. 1A is a schematic illustration of a superinductor including at least three Josephson junctions according to an embodiment of the invention.

FIG. 1A is a schematic illustration of a superinductor 100 according to an embodiment of the invention. The superinductor 100 includes a substrate 102, and a first vertical stack 104 extending in a vertical direction D from a surface 106 of the substrate 102. The first vertical stack 104 includes a first Josephson junction 108 and a second Josephson junction 110 connected in series along the vertical direction D. The superinductor 100 includes a second vertical stack 112 extending in the vertical direction D from the surface 106 of the substrate 102. The second vertical stack 112 includes a third Josephson junction 114. The second vertical stack 112 is spaced apart from the first vertical stack 104.

The superinductor 100 includes a superconducting connector 118 connecting the first and second vertical stacks 104, 112 in series such that the first Josephson junction 108, second Josephson junction 110, and third Josephson junction 114 are connected in series.

In some embodiments, the top connection doesn't have to short two vertical stacks. Both vertical stacks can have a tunnel barrier termination, for example, but not limited to a tunnel barrier, and it can be shorted from top. This will add two more inductors in series. This embodiment can provide some more fabrication flexibility.

Figure 1B:
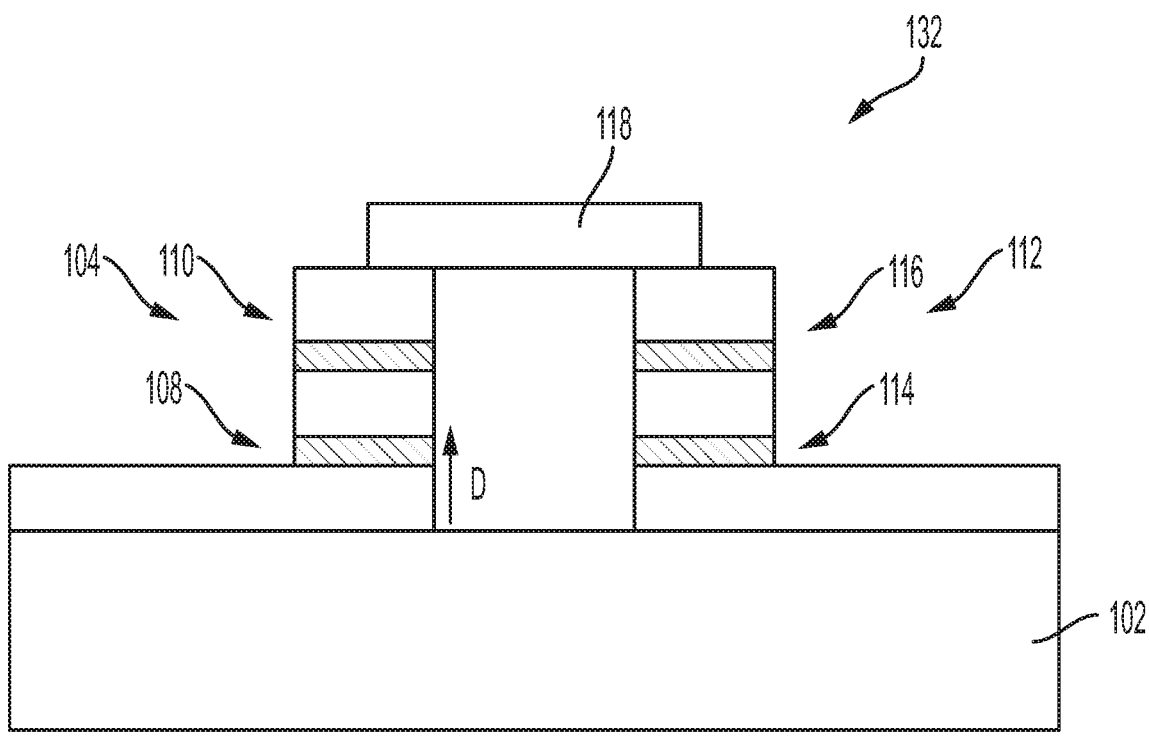
FIG. 1B is a schematic illustration of a superinductor including two Josephson junctions in a first vertical stack and two Josephson junctions in a second vertical stack.

FIG. 1B is a schematic illustration of a superinductor 132 according to an embodiment of the invention. In addition to the features shown in FIG. 1A, the second vertical stack 112 of the superinductor 132 includes a fourth Josephson junction 116 connected in series with the third Josephson junction 114 along the vertical direction D. The superconducting connector 118 connects the first and second vertical stacks 104, 112 in series such that the first Josephson junction 108, second Josephson junction 110, third Josephson junction 114, and fourth Josephson junction 116 are connected in series.

The vertical direction D may be substantially normal to the surface 106 of the substrate 102. The vertical direction D may be exactly normal to the surface 106 of the substrate 102, or may be approximately normal to the surface 106 of the substrate 102. According to an embodiment of the invention, the first vertical stack 104 and the second vertical stack 112 have a same number of Josephson junctions, as shown in FIG. 1B, for example. According to an embodiment of the invention, the superconducting connector 118 connecting the first and second vertical stacks 104, 112 extends in a direction substantially parallel to the surface 106 of the substrate 102. According to an embodiment of the invention, each of the first, second, third, and fourth Josephson junctions includes a tunnel barrier layer disposed between two superconducting layers. For example, in FIG. 1A, the second Josephson junction 110 includes a tunnel barrier layer 120 disposed between two superconducting layers 122, 124. The third Josephson junction 114 includes a tunnel barrier layer 126 disposed between two superconducting layers 128, 130. The height of each tunnel barrier layer may be, for example, about 1 nm.

Figure 2:
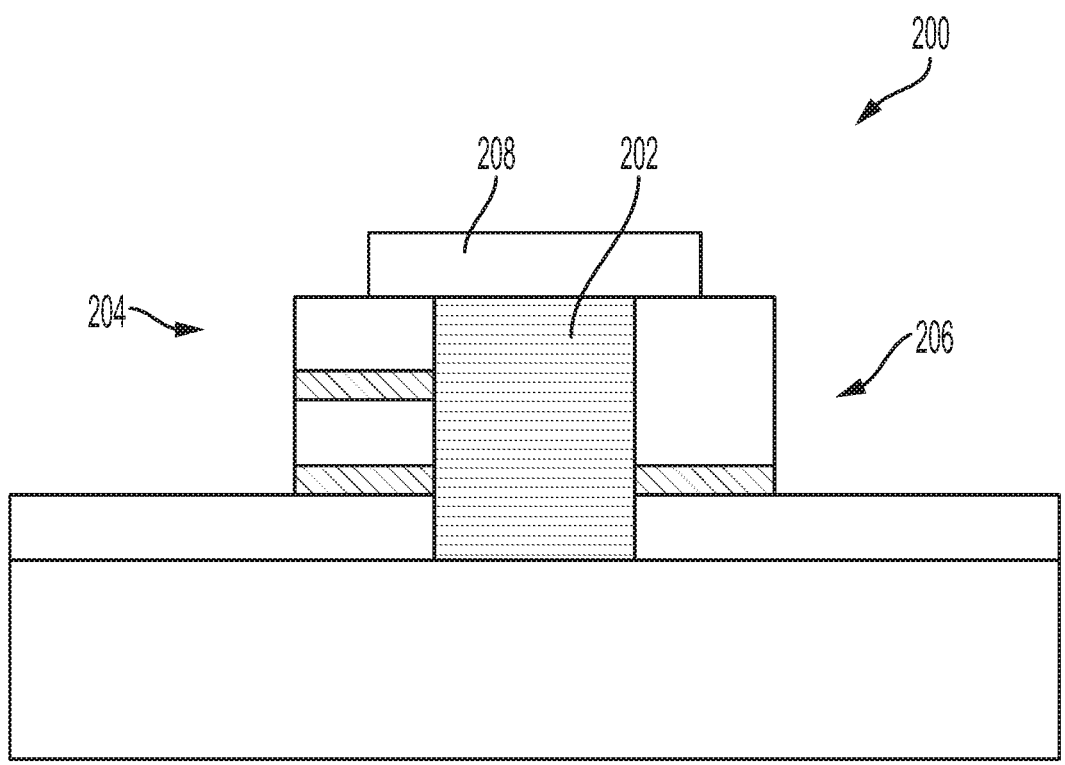
FIG. 2 is a schematic illustration of a superinductor including a support material.

FIG. 2 is a schematic illustration of a superinductor 200 according to an embodiment of the invention. The superinductor 200 includes the features of the superinductor 100 shown in FIG. 1A, and further includes a support material 202 disposed between the first and second vertical stacks 204, 206 and under the superconducting connector 208. The support material 202 may be a dielectric material. For example, the support material 202 may be silicon oxide or a spin-on glass. The support material 202 may be a dielectric material that can be easily removed, for example, by etching.

Figure 3A:
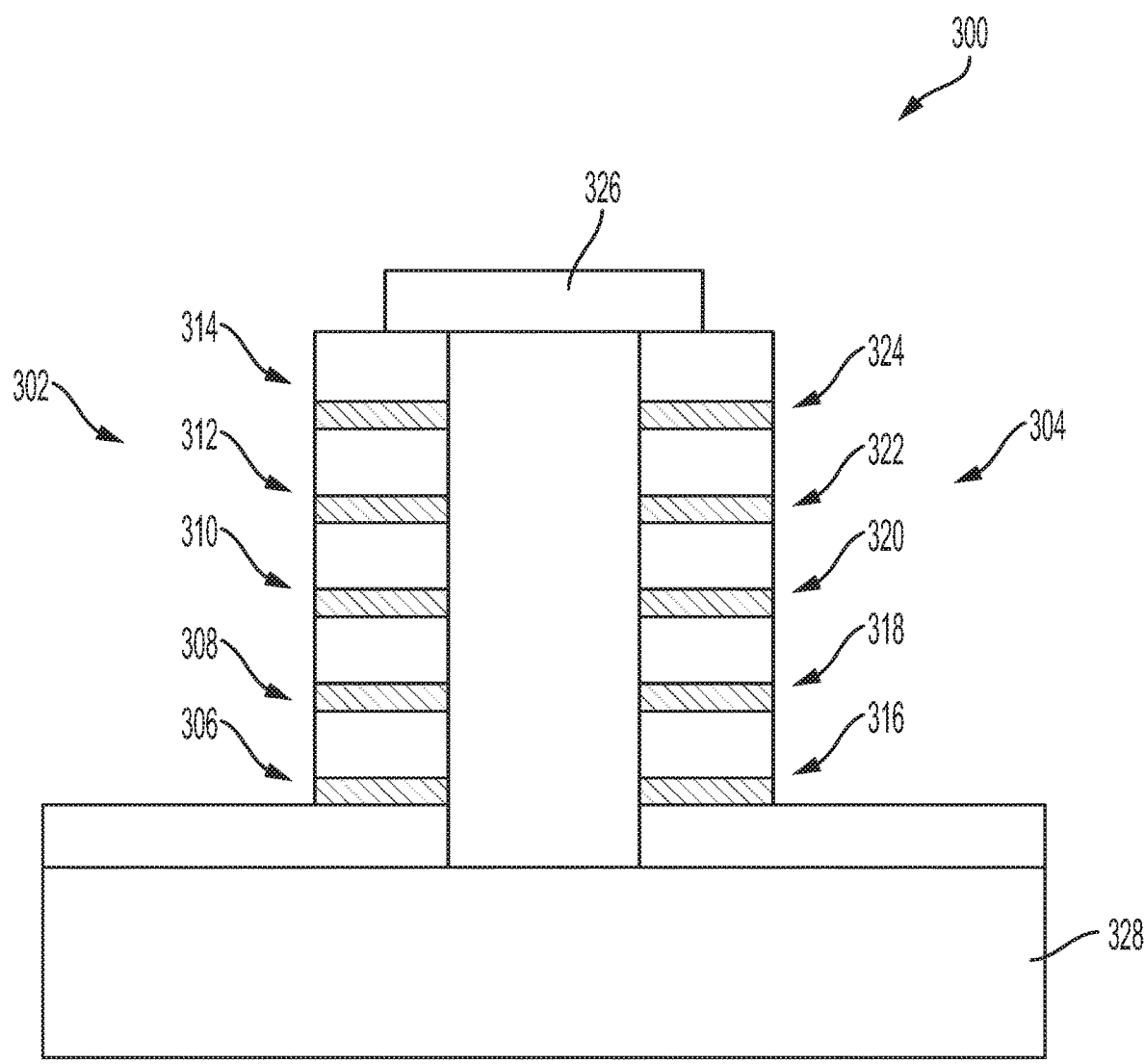
FIG. 3A is a schematic illustration of a superinductor having a first vertical stack and a second vertical stack that each include at least five Josephson junctions.

By forming at least two Josephson junctions in a vertical stack, the two Josephson junctions cover less surface area of the surface of the substrate than they would if they were formed side-by-side. Further, there is no surface area penalty for further increasing the number of Josephson junctions per stack. For example, FIG. 3A is a schematic illustration of a superinductor 300 having a first vertical stack 302 and a second vertical stack 304 that each include at least five Josephson junctions. The first vertical stack 302 includes five Josephson junctions 306, 308, 310, 312, 314 connected in series. The second vertical stack 304 includes five Josephson junctions 316, 318, 320, 322, 324 connected in series. A superconducting connector 326 connects the first and second vertical stacks 302, 304 in series such that the five Josephson junctions 306, 308, 310, 312, 314 in the first vertical stack 302 and the five Josephson junctions 316, 318, 320, 322, 324 in the second vertical stack 304 are connected in series.

As shown in FIG. 3A as compared to FIGS. 1A and 1B, the addition of three or four Josephson junctions per vertical stack does not increase the surface area of the first and second vertical stacks 302, 304 on the surface of the substrate 328. According to an embodiment of the invention, the surface area of each vertical stack is about 1 $\mu m^2$.

According to an embodiment of the invention, the first vertical stack and the second vertical stack each include at least 20, 50, 100, or 200 Josephson junctions. When the first and second vertical stacks are connected, the superinductor includes 40, 100, 200, or 400 Josephson junctions connected in series. The numbers of Josephson junctions listed here are provided as non-limiting examples. The first and second vertical stacks could include alternative number of Josephson junctions. The number of Josephson junctions per stack may depend on the desired inductance of the superinductor, and on the materials used to form the individual Josephson junctions. As the inductance of each individual Josephson junction increases, the number of Josephson junctions required to meet a predetermined total inductance decreases.

Figure 3B:
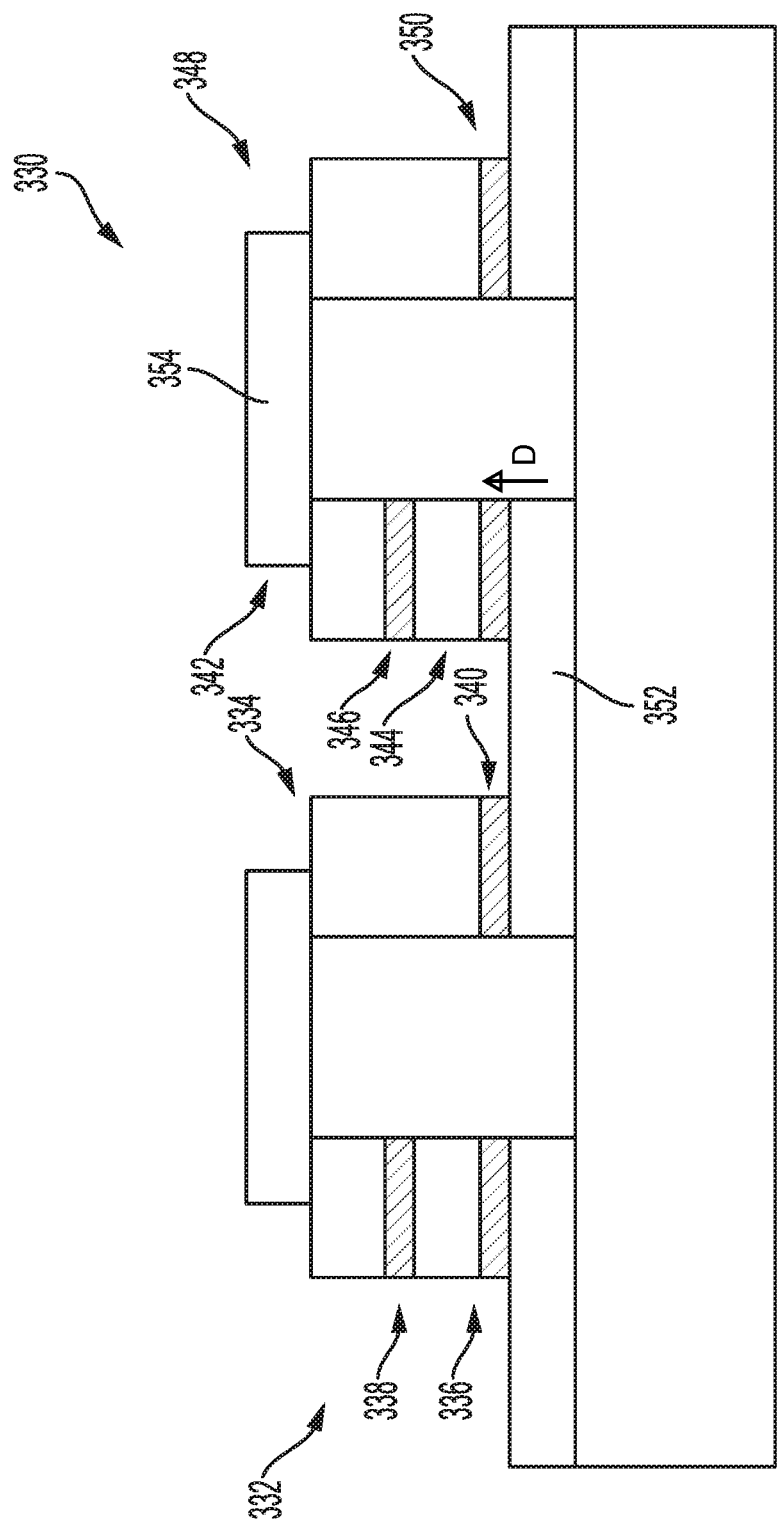
FIG. 3B is a schematic illustration of a superinductor that includes four vertical stacks.

According to an embodiment of the invention, the superinductor includes three or more vertical stacks. FIG. 3B is a schematic illustration of a superinductor 330 that includes four vertical stacks. In addition to first and second vertical stacks 332, 334 including three Josephson junctions 336, 338, 340, the superinductor 330 includes a third vertical stack 342 extending in the vertical direction D. The third vertical stack includes a fourth Josephson junction 344 and a fifth Josephson junction 346 connected in series along the vertical direction D. The superinductor 330 includes a fourth vertical stack 348 extending in the vertical direction D from the surface of the substrate. The fourth vertical stack 348 includes a sixth Josephson junction 350. The superinductor 330 includes superconducting connectors 352, 354 connecting the third and fourth vertical stacks 342, 348 in series with the first and second vertical stacks 332, 334 such that the first Josephson junction 336, second Josephson junction 338, third Josephson junction 340, fourth Josephson junction 344, fifth Josephson junction 346, and sixth Josephson junction 350 are connected in series.

Figure 4:
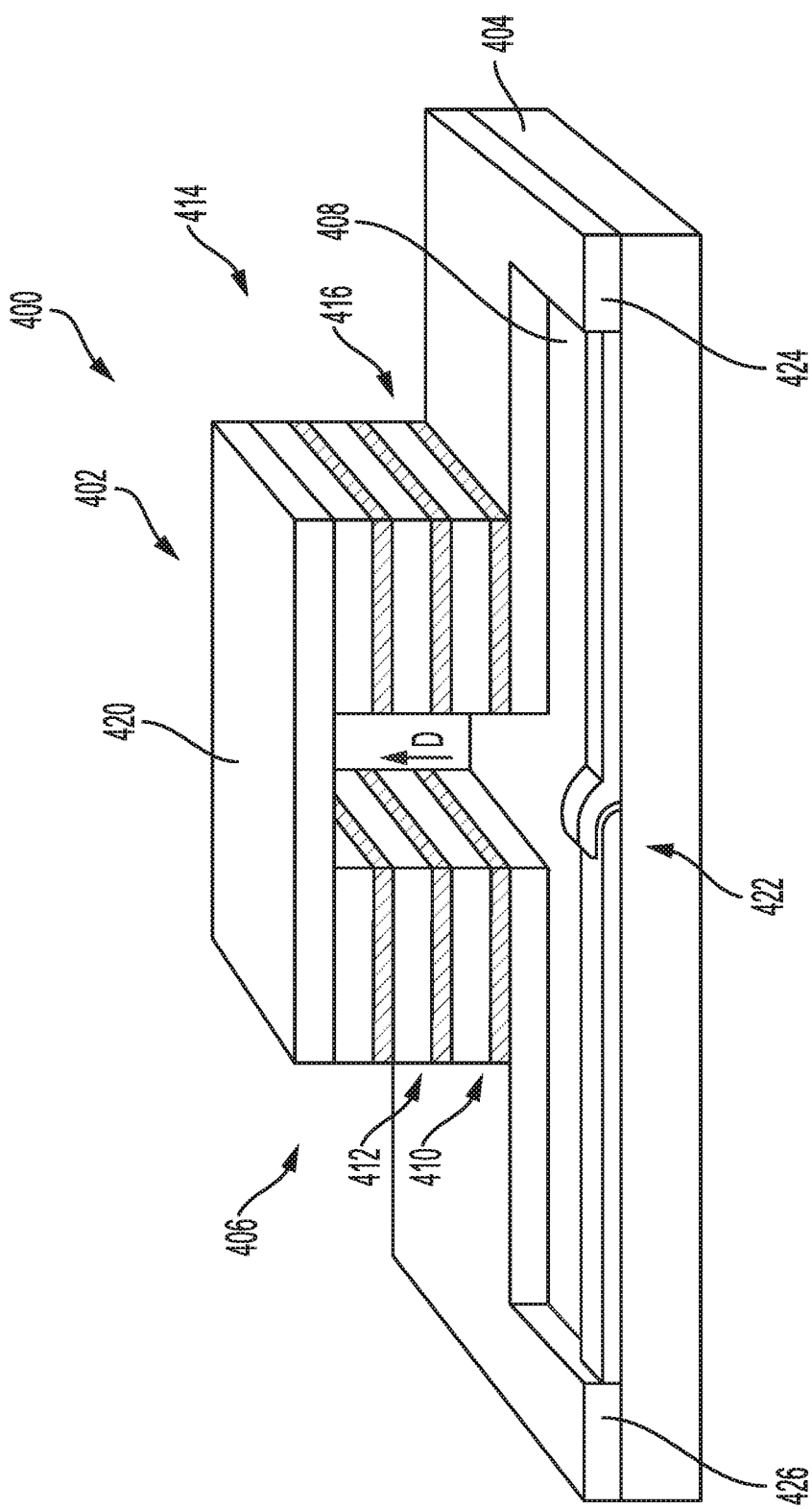
FIG. 4 is a schematic illustration of a fluxonium qubit according to an embodiment of the invention.

According to an embodiment of the invention, a superinductor is connected in parallel with a Josephson junction to form a fluxonium qubit. FIG. 4 is a schematic illustration of a fluxonium qubit 400 according to an embodiment of the invention. The fluxonium qubit 400 includes a superinductor 402. The superinductor 402 includes a substrate 404, and a first vertical stack 406 extending in a vertical direction D from a surface 408 of the substrate 404. The first vertical stack 406 includes a first Josephson junction 410 and a second Josephson junction 412 connected in series along the vertical direction. The superinductor 402 includes a second vertical stack 414 extending in the vertical direction D from the surface 408 of the substrate 404. The second vertical stack 414 includes a third Josephson junction 416. The second vertical stack 414 is spaced apart from the first vertical stack 406. The superinductor 402 further includes a superconducting connector 420 connecting the first and second vertical stacks 406, 414 in series such that the first Josephson junction 410, second Josephson junction 412, and third Josephson junction 416 are connected in series. Although, FIG. 4 is an example with six Josephson junctions, the general concepts of the current invention are not limited to that particular number. There can be more than a total of six Josephson junctions, or less than a total of six Josephson junctions in other embodiments.

In addition to the superinductor 402, the fluxonium qubit 400 includes a shunted Josephson junction 422 connected to the superinductor 402 with superconducting wires 424, 426 such that the first Josephson junction 410, second Josephson junction 412, and third Josephson junction 416 of the superinductor 402 that are in series are connected in parallel with the shunted Josephson junction 422. The fluxonium qubit 400 may include a superinductor that has more than two vertical stacks, like the superinductor 330 schematically illustrated in FIG. 3B.

Figure 5:
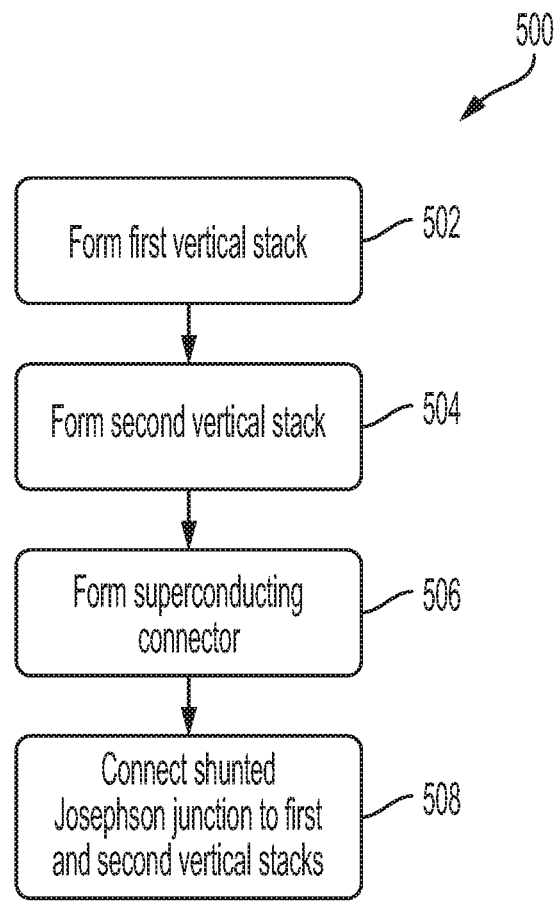
FIG. 5 is a flowchart that illustrates a method of producing a fluxonium qubit according to an embodiment of the current invention.

FIG. 5 is a flowchart that illustrates a method 500 of producing a fluxonium qubit according to an embodiment of the current invention. Note that the order of the steps in FIG. 5 are not limiting. For example, the step that appears last in FIG. 5 can also be the first one in some embodiments. The method 500 includes forming, on a substrate, a first vertical stack 502 extending in a vertical direction from a surface of the substrate. The first vertical stack includes a first Josephson junction and a second Josephson junction connected in series along the vertical direction. The method 500 further includes forming, on the substrate, a second vertical stack 504 extending in the vertical direction from the surface of the substrate. The second vertical stack includes a third Josephson junction. The second vertical stack is spaced apart from the first vertical stack. The method 500 further includes forming a superconducting connector 506 connecting the first and second vertical stacks in series such that the first, second, and third Josephson junctions are connected in series. The method 500 further includes connecting a shunted Josephson junction to the first and second vertical stacks 508 such that the first, second, and third Josephson junctions of the superinductor that are in series are connected in parallel with the shunted Josephson junction.

According to an embodiment of the invention, the forming process is an additive process with subtractive steps throughout. FIGS. 6-20 are schematic illustrations of an additive process that can be used to form a superinductor according to an embodiment of the invention. In FIGS. 6-20, like reference numerals refer to like features, for example, reference numeral 600 in FIGS. 6 and 700 in FIG. 7 both refer to a substrate.

Figure 6:
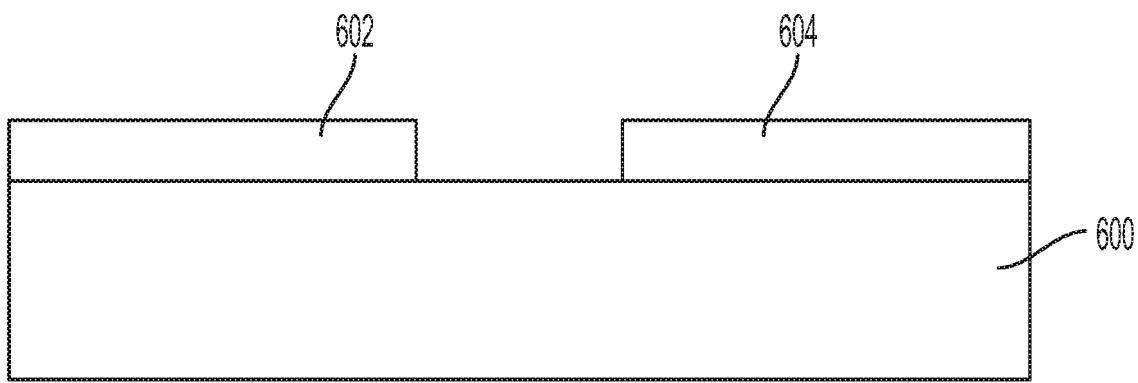
FIGS. 6-20 are schematic illustrations of a process for forming a superinductor.

To produce the superinductor, a superconducting material is formed on a substrate 600, as shown in FIG. 6. A mask and shadow evaporation technique may be used to apply the superconducting material such that it has a first portion 602 and a second portion 604 spaced apart from the first portion 602. According to an embodiment of the invention, the first portion 602 is spaced apart from the second portion 604 by about 1 μm. The substrate 600 may be a silicon substrate, for example, though embodiments of the invention are not limited to a silicon substrate. The superconducting material may be niobium, for example, or any superconducting material suitable for quantum computing applications.

Figure 7:
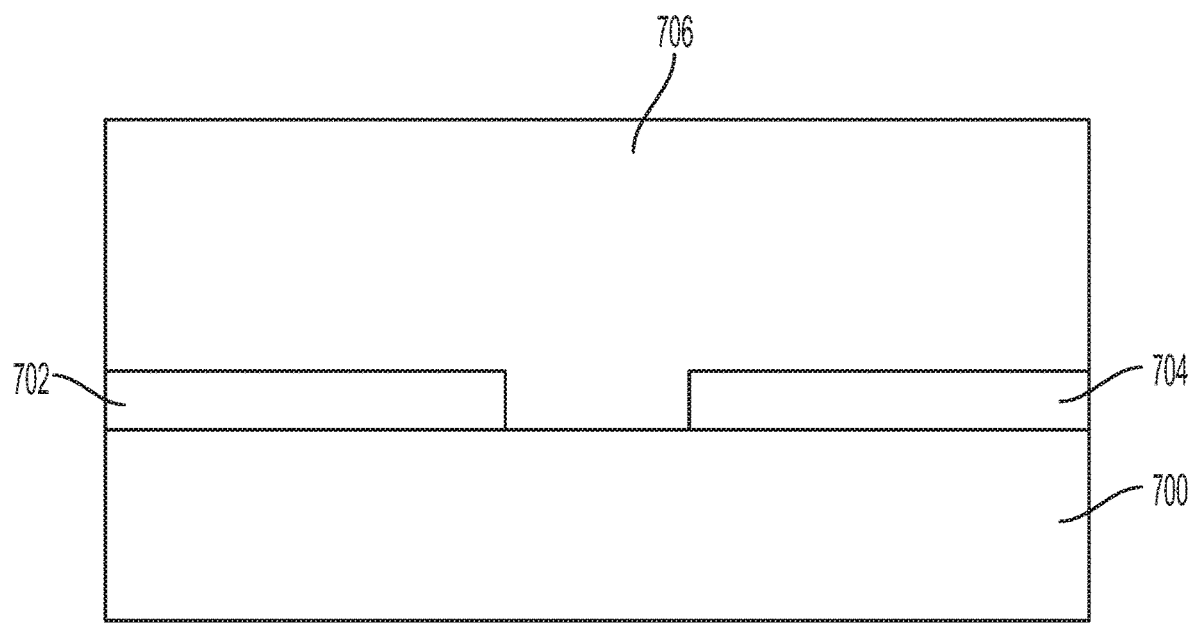

As shown in FIG. 7, once the first portion 702 and second portion 704 of the superconducting material are formed, a resist 706 can be spun and baked on the first portion 702, second portion 704, and substrate 700. The resist may be an ultraviolet photo resist or an electron beam resist, for example. The resist can then be patterned to form two holes 808, 809, as shown in FIG. 8.

Figure 8:
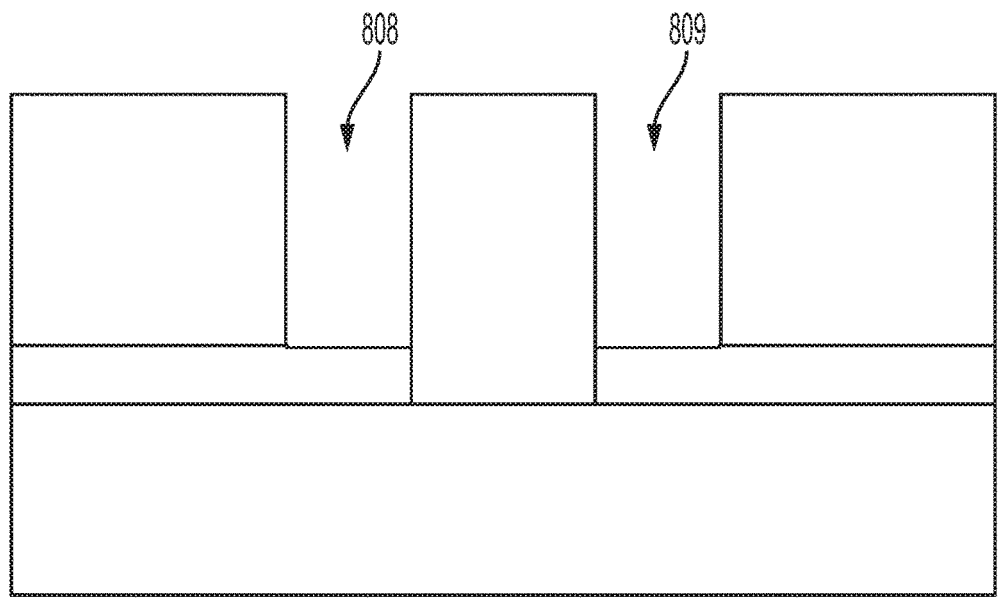
Figure 9:
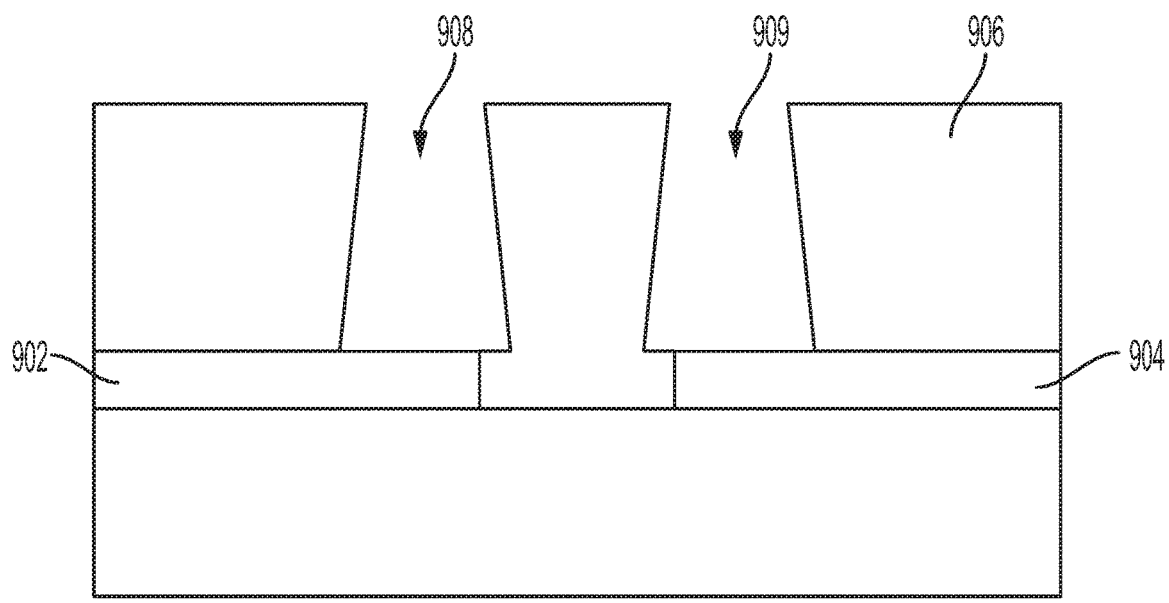

In addition or as an alternative to the patterning shown in FIG. 8, the resist can be ion milled to form a reverse profile. FIG. 9 shows holes 908, 909 formed by ion milling. The holes 908, 909 are wider at the upper surface of the first portion 902 and second portion 904 of the superconducting material than at the upper surface of the resist 906. The reverse profile may facilitate removal of the resist later on in the production process.

Figure 10:
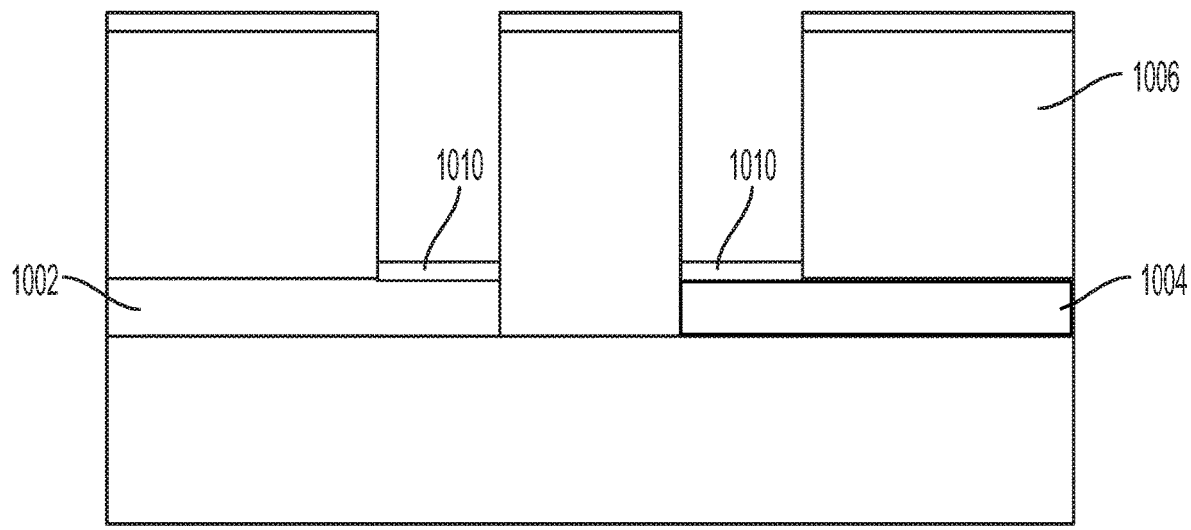

FIG. 10 shows the deposition of a tunnel barrier layer 1010. The tunnel barrier layer 1010 is formed on the first portion 1002 and second portion 1004 of the superconducting material. The tunnel barrier layer 1010 may be a dielectric material. For example, the tunnel barrier layer 1010 may be an oxide, such as aluminum oxide. Alternatively, instead of depositing a material to form the tunnel barrier layer 1010, the tunnel barrier layer 1010 may be formed by exposing the upper surface of the first portion 902 and second portion 904 of the superconducting material to oxygen, thereby forming an oxide. According to an embodiment of the invention, the tunnel barrier layer 1010 has a thickness between about 0.5 nm and 1.5 nm. According to an embodiment of the invention, the tunnel barrier layer 1010 has a thickness of about 1 nm.

Figure 11:
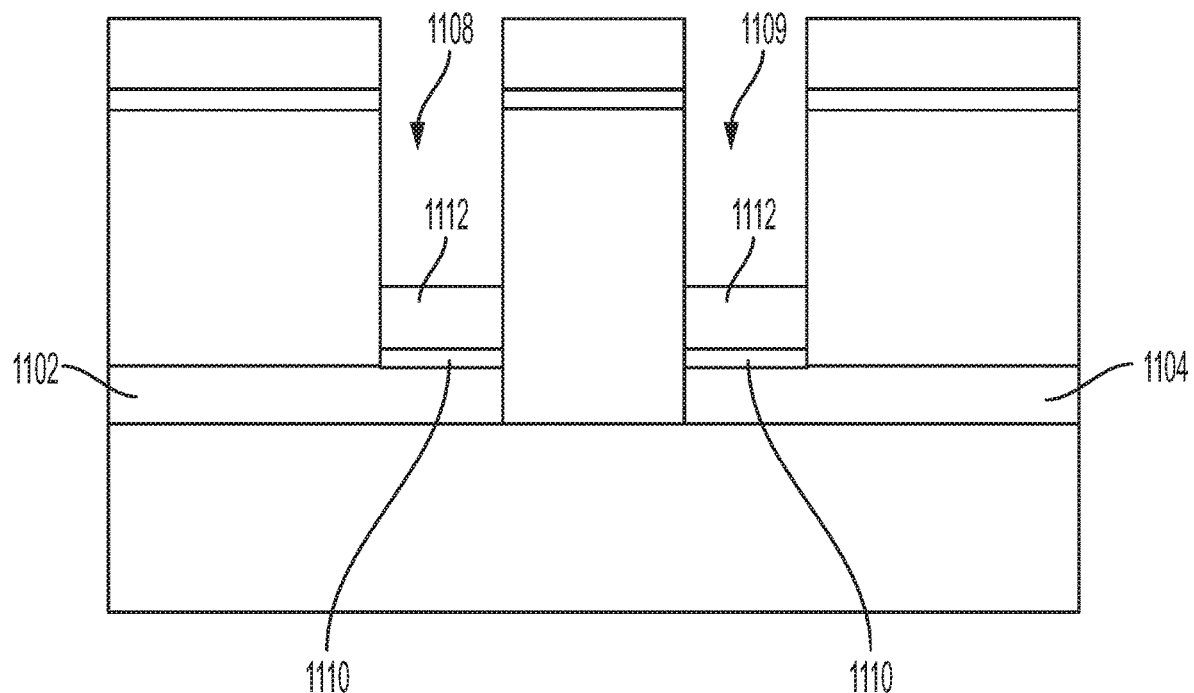

As shown in FIG. 11, once the tunnel barrier layer 1110 has been formed, a layer of superconducting material 1112 is formed on the tunnel barrier layer. The combination of the first portion 1102, the tunnel barrier layer 1110, and the superconducting material 1112 form a first Josephson junction. Similarly, the combination of the second portion 1104, the tunnel barrier layer 1110, and the superconducting material 1112 form a second Josephson junction. The superconducting material 1112 according to an embodiment of the invention may have a thickness of about 30-35 nm. According to an embodiment of the invention, the resist 1006 has a thickness of about 1 μm, allowing for many alternating layers of the tunnel barrier and the superconducting material to be formed within the holes 1108, 1109. According to an embodiment of the invention, the resist 1006 has a thickness greater than 1 μm.

Figure 12:
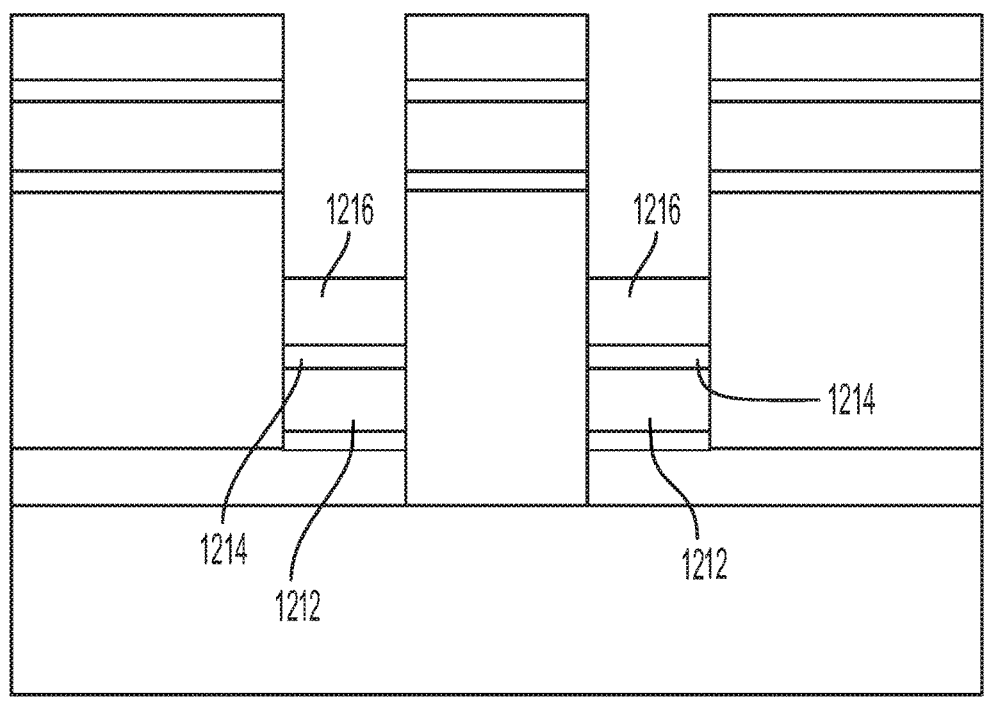

FIG. 12 shows the result of forming an additional tunnel barrier layer 1214 by deposition or by exposure to oxygen, for example, and an additional layer of superconducting material 1216. The combination of the superconducting material 1212, the tunnel barrier layer 1214, and the superconducting material 1216 form an additional Josephson junction on each vertical stack. Additional Josephson junctions may be added by alternately forming layers of the tunnel barrier and the superconducting material.

Figure 13:
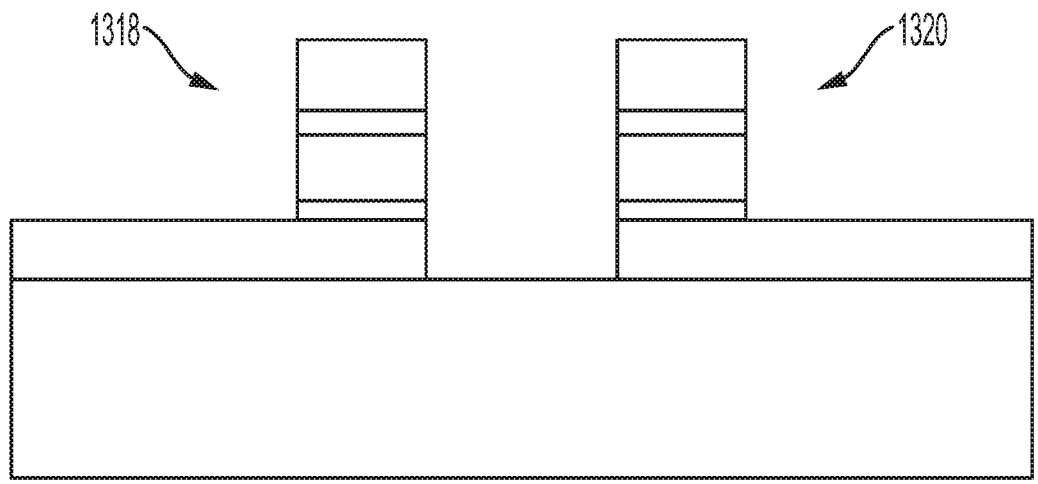

The process continues with lift-off of the resist, resulting in the structure shown in FIG. 13. The structure includes two vertical stacks 1318, 1320. At least one of the vertical stacks includes two or more Josephson junctions. According to some embodiments, each vertical stack includes at least five, twenty, fifty, or one hundred Josephson junctions. The first and second vertical stacks may include the same number of Josephson junctions. Alternatively, the first and second vertical stacks may include different numbers of Josephson junctions.

Figure 14:
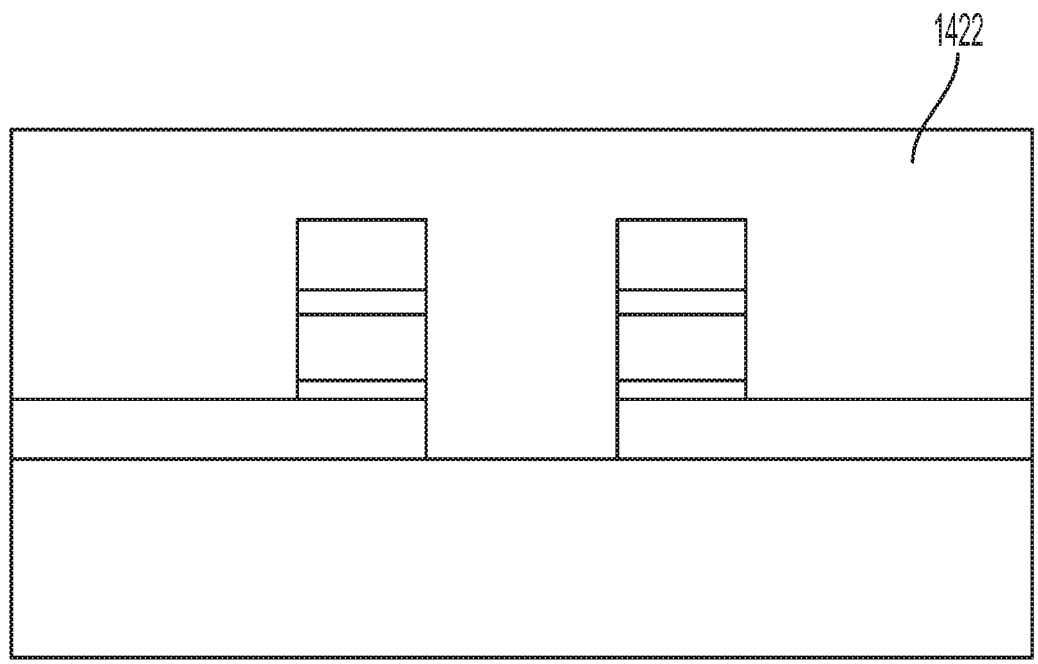
Figure 15:
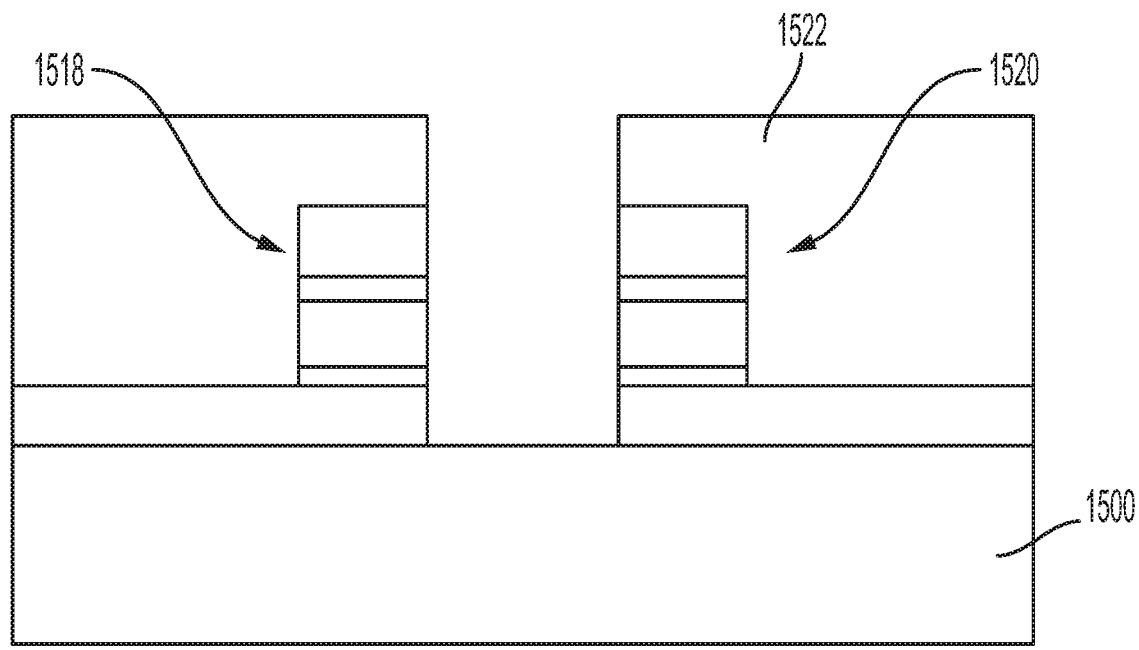
Figure 16:
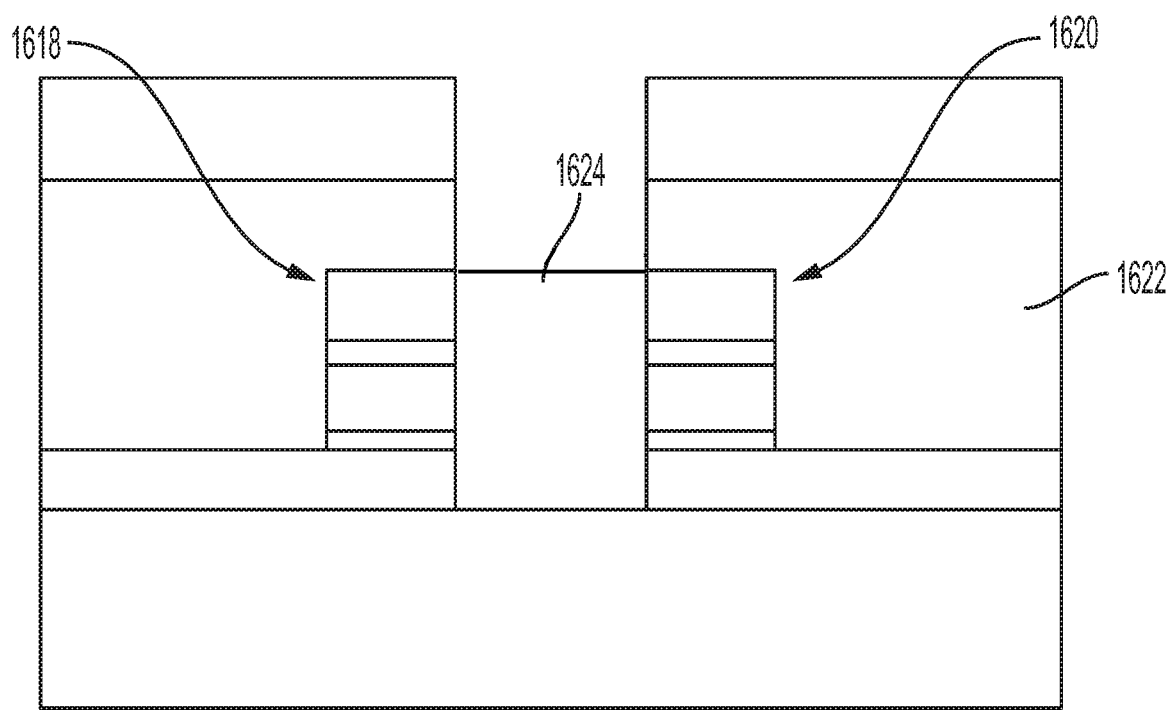
Figure 17:
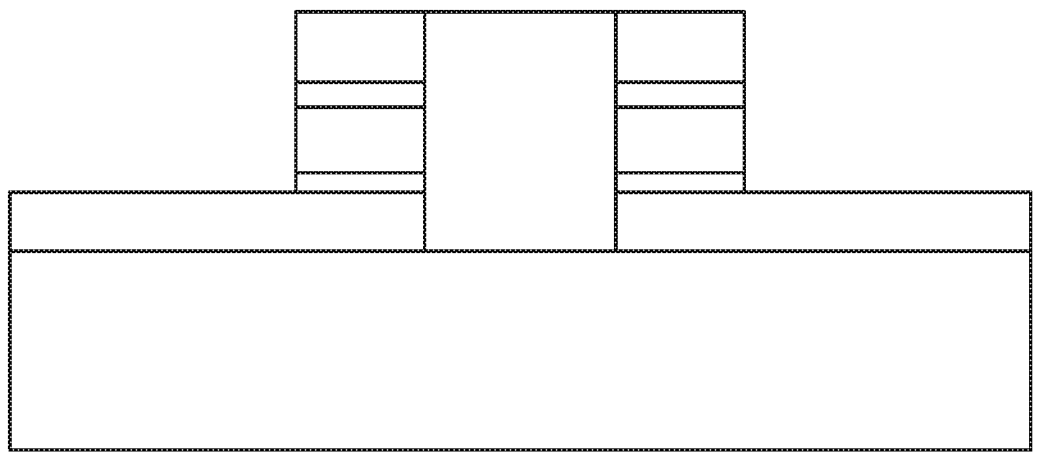

Once the resist has been removed, a new layer of resist 1422 is deposited and baked, as shown in FIG. 14, and then patterned to expose the substrate 1500 between the two vertical stacks 1518, 1520, as shown in FIG. 15. The process then includes depositing an oxide or sacrificial material 1624 between the two vertical stacks 1618, 1620, as shown in FIG. 16. The oxide or sacrificial material 1624 is sufficiently wide to prevent tunneling between the two vertical stacks 1618, 1620. The oxide or sacrificial material 1624 acts as a support material for a subsequently-formed superconducting connector. Once the oxide or sacrificial material 1624 has been deposited, the resist 1622 can be removed. The resulting structure is shown in FIG. 17.

Figure 18:
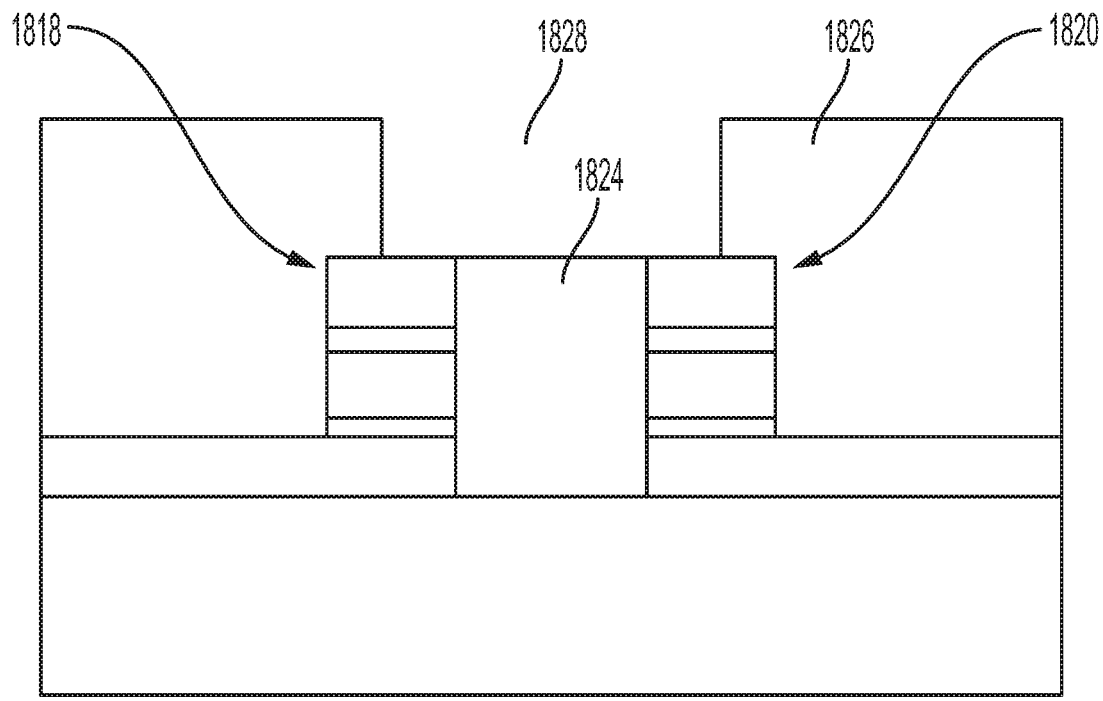

The process then includes forming a superconducting connector to connect the two vertical stacks 1818, 1820 in series. Before depositing the superconducting connector, a resist 1826 is deposited, baked, and then etched to form a hole 1828 exposing the oxide or sacrificial material 1824 and the uppermost superconducting layer of the two vertical stacks 1820, 1822, as shown in FIG. 18.

Figure 19:
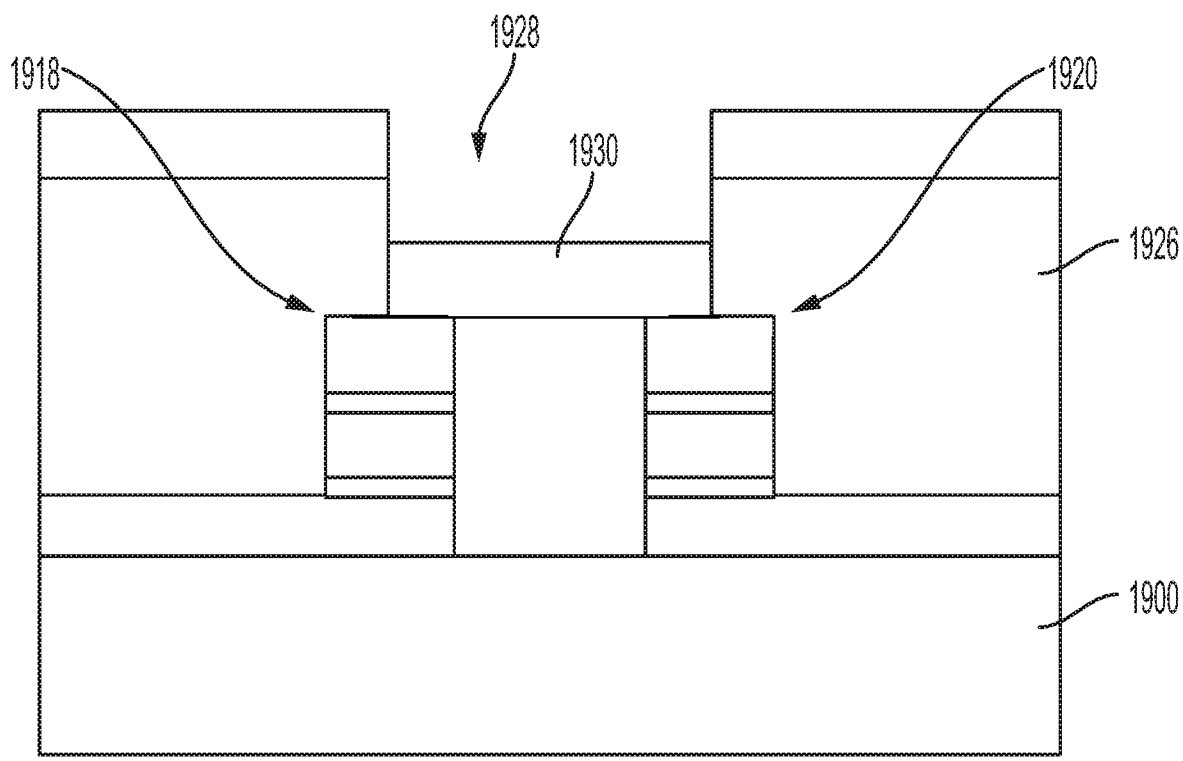

As shown in FIG. 19, a layer of superconducting material 1930 is deposited in the hole 1928 in the resist 1926. The superconducting material 1930 maybe deposited by dual angle evaporation, although the embodiments of the invention are not limited to dual angle evaporation of the superconducting material 1930. The superconducting material 1930 contacts the uppermost superconducting layer of the two vertical stacks 1918, 1920. Further, the superconducting material 1930 connects the Josephson junctions of the first vertical stack 1918 in series with the Josephson junctions of the second vertical stack 1920. According to an embodiment of the invention, the superconducting material 1930 extends in a direction substantially parallel to the surface of the substrate 1900.

Figure 20:
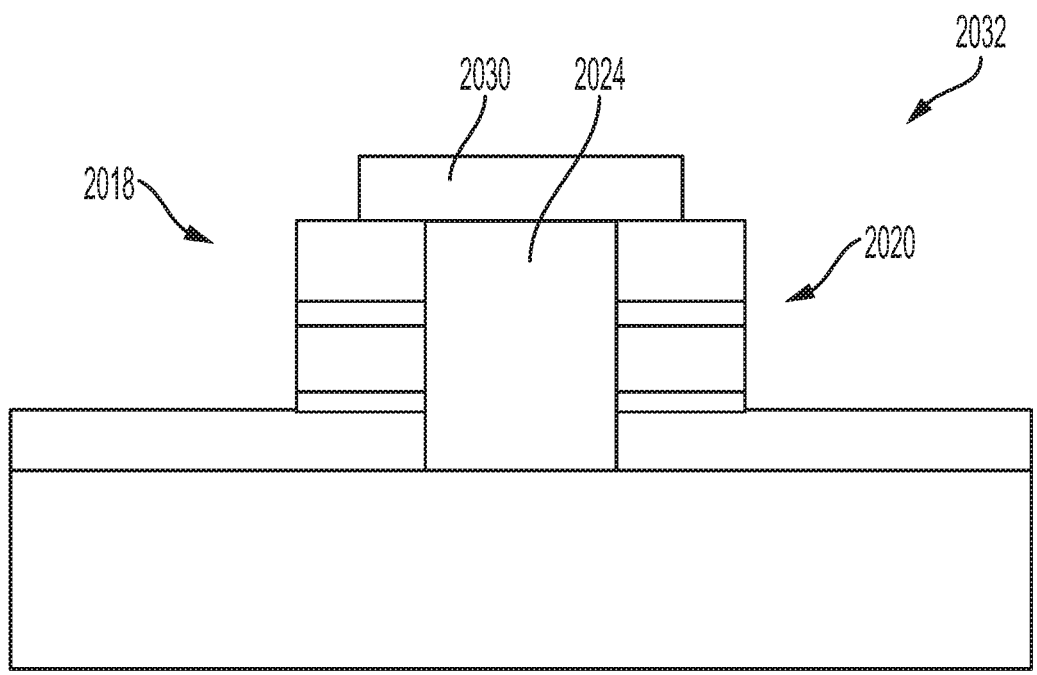

The process further includes removing the resist 1926, resulting in the superinductor 2032 shown in FIG. 20. Although the superinductor 2032 in FIG. 20 includes the oxide or sacrificial material 2024, the process may further include etching out the oxide or sacrificial material 2024, resulting in a superinductor similar to superinductor 100 shown in FIG. 1A, in which the layer of superconducting material 2030 is only supported by the two vertical stacks 2018, 2020.

Figure 21:
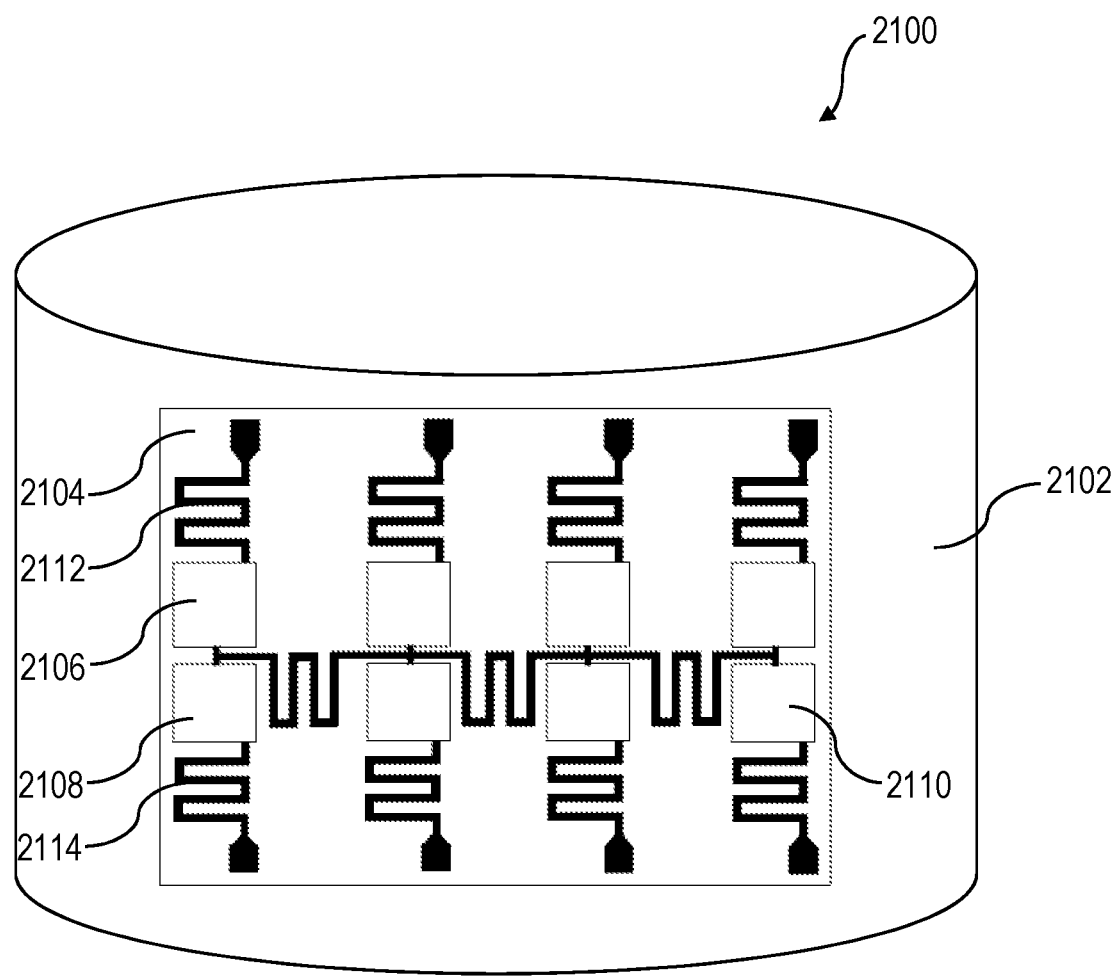
FIG. 21 is a schematic illustration of a quantum computer according to an embodiment of the invention.

FIG. 21 is a schematic illustration of a quantum computer 2100 according to an embodiment of the invention. The quantum computer 2100 includes a refrigeration system under vacuum including a containment vessel 2102. The quantum computer 2100 also includes a qubit chip 2104 contained within a refrigerated vacuum environment defined by the containment vessel 2102. The qubit chip 2104 includes a plurality of fluxonium qubits 2106, 2108, 2110. The fluxonium qubits 2106, 2108, 2110 may each include a separate substrate, or may be formed on the qubit chip 2104, with the qubit chip 2104 acting as a shared substrate. The quantum computer 2100 also includes a plurality of electromagnetic waveguides 2112, 2114 arranged within the refrigerated vacuum environment so as to direct electromagnetic energy to and receive electromagnetic energy from at least a selected one of the plurality of fluxonium qubits 2106, 2108, 2110. The electromagnetic waveguides 2112, 2114 may be formed on the qubit chip 2104, as shown in FIG. 21.

Each of the fluxonium qubits 2106, 2108, 2110 may have the vertical structure described herein. The vertical structure of the fluxonium qubits 2106, 2108, 2110 significantly reduces their footprint over traditional arrays. The fabrication is compatible with traditional superconducting circuit technology. The vertical stacks allow for arrays to be fabricated based on epitaxial stacks that can have better quality and lower loss than traditional angle-evaporated junctions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A fluxonium qubit, comprising:
    a superinductor, comprising:
        a substrate;
        a first vertical stack extending in a vertical direction from a surface of the substrate, the first vertical stack comprising a first Josephson junction and a second Josephson junction connected in series along the vertical direction;
        a second vertical stack extending in the vertical direction from the surface of the substrate and spaced apart from the first vertical stack, the second vertical stack comprising a third Josephson junction; and
        a superconducting connector connecting the first and second vertical stacks in series such that the first, second, and third Josephson junctions are connected in series; and
    a shunted Josephson junction connected to the superinductor with superconducting wires such that the first, second, and third Josephson junctions of the superinductor that are in series are connected in parallel with the shunted Josephson junction superinductor.

2. The fluxonium qubit according to claim 1, wherein the first vertical stack and the second vertical stack each comprise at least five Josephson junctions.

3. The fluxonium qubit according to claim 1, wherein the first vertical stack and the second vertical stack each comprise at least 50 Josephson junctions.

4. The fluxonium qubit according to claim 1, wherein the first vertical stack and the second vertical stack have a same number of Josephson junctions.

5. The fluxonium qubit according to claim 1, wherein the superconducting connector connecting the first and second vertical stacks extends in a direction substantially parallel to the surface of the substrate.

6. The fluxonium qubit according to claim 1, further comprising a support material disposed between the first and second vertical stacks and under the superconducting connector.

7. The fluxonium qubit according to claim 1, wherein each of the first, second, and third Josephson junctions includes a tunnel barrier layer disposed between two superconducting layers, and wherein the height of each tunnel barrier layer is about 1 nm.

8. The fluxonium qubit according to claim 1, wherein the first vertical stack is spaced apart from the second vertical stack by about 1 μm.

9. The fluxonium qubit according to claim 1, wherein the superinductor further comprises:
    a third vertical stack extending in the vertical direction, the third vertical stack comprising a fourth Josephson junction and a fifth Josephson junction connected in series along the vertical direction;
    a fourth vertical stack extending in the vertical direction from the surface of the substrate, the fourth vertical stack comprising a sixth Josephson junction;

superconducting connectors connecting the third and fourth vertical stacks in series with the first and second vertical stacks such that the first, second, third, fourth, fifth, and sixth Josephson junctions are connected in series, and wherein the shunted Josephson junction is connected to the superinductor such that the first, second, third, fourth, fifth, and sixth Josephson junctions of the superinductor that are in series are connected in parallel with the shunted Josephson junction.

10. A method of producing a fluxonium qubit, comprising:
forming, on a substrate, a first vertical stack extending in a vertical direction from a surface of the substrate, the first vertical stack comprising a first Josephson junction and a second Josephson junction connected in series along the vertical direction;
forming, on the substrate, a second vertical stack extending in the vertical direction from the surface of the substrate and spaced apart from the first vertical stack, the second vertical stack comprising a third Josephson junction;
forming a superconducting connector connecting the first and second vertical stacks in series such that the first, second, and third Josephson junctions are connected in series; and
connecting a shunted Josephson junction to the first and second vertical stacks such that the first, second, and third Josephson junctions of the superinductor that are in series are connected in parallel with the shunted Josephson junction.

11. The method according to claim 10, wherein the forming process is an additive process.

12. The method according to claim 10, wherein the forming process is a subtractive process.

13. The method according to claim 10, wherein the first vertical stack and the second vertical stack each comprise at least five Josephson junctions.

14. The method according to claim 10, wherein the first vertical stack and the second vertical stack each comprise at least 50 Josephson junctions.

15. The method according to claim 10, wherein the first vertical stack and the second vertical stack have a same number of Josephson junction.

16. The method according to claim 10, wherein the superconducting connector connecting the first and second vertical stacks extends in a direction substantially parallel to the surface of the substrate.

17. The method according to claim 10, wherein each of the first, second, and third Josephson junctions includes a tunnel barrier layer disposed between two superconducting layers, and wherein the height of each tunnel barrier layer is about 1 nm.

18. The method according to claim 10, wherein the first vertical stack is spaced apart from the second vertical stack by about 1 µm.

19. The method according to claim 10, further comprising forming a support material between the first and second vertical stacks and under the superconducting connector.

20. A quantum computer, comprising:
a refrigeration system under vacuum comprising a containment vessel;
a qubit chip contained within a refrigerated vacuum environment defined by the containment vessel, wherein the qubit chip comprises a plurality of fluxonium qubits; and
a plurality of electromagnetic waveguides arranged within the refrigerated vacuum environment so as to direct electromagnetic energy to and receive electromagnetic energy from at least a selected one of the plurality of fluxonium qubits;
wherein each of the plurality of fluxonium qubits comprises:
a superinductor, comprising:
a substrate;
a first vertical stack extending in a vertical direction from a surface of the substrate, the first vertical stack comprising a first Josephson junction and a second Josephson junction connected in series along the vertical direction;
a second vertical stack extending in the vertical direction from the surface of the substrate and spaced apart from the first vertical stack, the second vertical stack comprising a third Josephson junction; and
a superconducting connector connecting the first and second vertical stacks in series such that the first, second, and third Josephson junctions are connected in series; and
a shunted Josephson junction connected to the superinductor with superconducting wires such that the first, second, and third Josephson junctions of the superinductor that are in series are connected in parallel with the shunted Josephson junction.

21. The quantum computer according to claim 20, wherein the first vertical stack and the second vertical stack each comprise at least 50 Josephson junctions.

22. The quantum computer according to claim 20, further comprising a support material disposed between the first and second vertical stacks and under the superconducting connector.

23. The quantum computer according to claim 20, wherein each of the first, second, and third Josephson junctions includes a tunnel barrier layer disposed between two superconducting layers, and wherein the height of each tunnel barrier layer is about 1 nm.

24. The quantum computer according to claim 20, wherein the first vertical stack is spaced apart from the second vertical stack by about 1 µm.

25. The quantum computer according to claim 20, wherein the superinductor further comprises:
a third vertical stack extending in the vertical direction, the third vertical stack comprising a fourth Josephson junction and a fifth Josephson junction connected in series along the vertical direction;
a fourth vertical stack extending in the vertical direction from the surface of the substrate, the fourth vertical stack comprising a sixth Josephson junction;
superconducting connectors connecting the third and fourth vertical stacks in series with the first and second vertical stacks such that the first, second, third, fourth, fifth, and sixth Josephson junctions are connected in series, and
wherein the shunted Josephson junction is connected to the superinductor such that the first, second, third, fourth, fifth, and sixth Josephson junctions of the superinductor that are in series are connected in parallel with the shunted Josephson junction.

* * * * *